(12) United States Patent
Hwang

(10) Patent No.: US 12,366,964 B2
(45) Date of Patent: Jul. 22, 2025

(54) STORAGE DEVICE OPERATED BY ZONE AND DATA PROCESSING SYSTEM INCLUDING THE SAME

(71) Applicant: Samsung Electronics Co., Ltd., Suwon-si (KR)

(72) Inventor: Joo Young Hwang, Suwon-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 147 days.

(21) Appl. No.: 18/325,468

(22) Filed: May 30, 2023

(65) Prior Publication Data

US 2024/0143183 A1 May 2, 2024

(30) Foreign Application Priority Data

Oct. 27, 2022 (KR) .................. 10-2022-0140300

(51) Int. Cl.
| | |
|---|---|
| *G11C 7/14* | (2006.01) |
| *G06F 3/06* | (2006.01) |
| *G11C 16/04* | (2006.01) |
| *G11C 16/34* | (2006.01) |

(52) U.S. Cl.
CPC .......... *G06F 3/0613* (2013.01); *G06F 3/0653* (2013.01); *G06F 3/0659* (2013.01); *G06F 3/0679* (2013.01); *G11C 16/0483* (2013.01); *G11C 16/349* (2013.01); *G11C 7/14* (2013.01)

(58) Field of Classification Search
CPC .................................. G11C 7/14; G06F 3/06
See application file for complete search history.

(56) References Cited

U.S. PATENT DOCUMENTS

| | | | |
|---|---|---|---|
| 11,194,489 B2 | 12/2021 | Alrod et al. | |
| 11,200,161 B2 | 12/2021 | Bennett et al. | |
| 11,209,989 B2 | 12/2021 | Bjørling et al. | |
| 2019/0171381 A1* | 6/2019 | Ioannou | ................ G06F 3/0679 |
| 2021/0286762 A1 | 9/2021 | Benisty et al. | |

(Continued)

FOREIGN PATENT DOCUMENTS

KR 20200040044 A 4/2020

*Primary Examiner* — Jason Lappas
(74) *Attorney, Agent, or Firm* — Harness, Dickey & Pierce, P.L.C.

(57) ABSTRACT

A storage device operated by zone and data processing system including the same are provided. A storage device comprises a memory device including a plurality of memory blocks including a plurality of memory cells connected to a plurality of gate lines, and a memory controller controlling the memory device, wherein memory cells of a first group among the plurality of memory cells include cells of a first type, memory cells other than the memory cells of the first group among the plurality of memory cells are defined as a second group, and the memory cells of the second group include cells of a second type different from the first type, the memory controller is configured to transmit size information of the memory cells of the first group so that the host programs data into the memory cells of the first group, and store an update of the data programmed in the memory cells of the first group with respect to the memory cells of the second group, and the host does not perform a plurality of write requests to the same address with respect to the memory cells of the first group more than twice.

20 Claims, 13 Drawing Sheets

(56) References Cited

U.S. PATENT DOCUMENTS

2021/0373802 A1 12/2021 Helmick et al.
2022/0004496 A1 1/2022 Ha
2022/0137817 A1 5/2022 Kwak et al.

* cited by examiner

STORAGE DEVICE OPERATED BY ZONE AND DATA PROCESSING SYSTEM INCLUDING THE SAME

CROSS-REFERENCE TO RELATED APPLICATION

This application claims priority from Korean Patent Application No. 10-2022-0140300 filed on Oct. 27, 2022 in the Korean Intellectual Property Office, and all the benefits accruing therefrom under 35 U.S.C. 119, the contents of which in its entirety are herein incorporated by reference.

BACKGROUND

1. Technical Field

The present disclosure relates to storage devices and data processing systems, and more particularly, to storage devices and data processing systems supporting zoned named space interface.

2. Description of the Related Art

A storage device is a memory system and is a device for storing data based on a request from a host such as a mobile terminal such as a computer, a smart phone, or a tablet, or various electronic devices. Storage devices may include a hard disk drive, a solid state drive, a universal flash storage (UFS) device, an embedded multi media card (eMMC), and the like.

With the recent development of data processing technology, the host may process a large amount of data at high speed, and with the development of memory integration technology, the storage device may also store a large amount of data received from the host. Meanwhile, in order to increase usage efficiency of a memory, the storage device may compress and store the data received from the host, decompress the compressed data, and transmit the compressed data to the host.

SUMMARY

Aspects of the present disclosure provide storage devices with improved space utilization.

Aspects of the present disclosure also provide data processing systems with improved space utilization.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to some aspects of the present disclosure, there is provided a storage device comprises a memory device including a plurality of memory blocks including a plurality of memory cells connected to a plurality of gate lines, memory cells of a first group among the plurality of memory cells including memory cells of a first type, memory cells other than the memory cells of the first group among the plurality of memory cells are a second group, and memory cells of the second group including memory cells of a second type different from the first type and a memory controller configured to control the memory device, transmit size information of the memory cells of the first group to control a host to program data into the memory cells of the first group, store an update of the data programmed in the memory cells of the first group with respect to the memory cells of the second group, and control the host to not perform a plurality of write requests to the same address with respect to the memory cells of the first group more than an allowed number of writes.

According to some aspects of the present disclosure, there is provided a data processing system comprises a host, and a storage device configured to exchange data with the host, the storage device including a memory device including a plurality of memory blocks including a plurality of memory cells connected to a plurality of gate lines, memory cells of a first group among the plurality of memory cells including memory cells of a first type, memory cells other than the memory cells of the first group among the plurality of memory cells are a second group, and the memory cells of the second group including memory cells of a second type different from the first type, and a memory controller configured to control the memory device, and transmit size information of the memory cells of the first group to control the host to program data into the memory cells of the first group.

According to some aspects of the present disclosure, there is provided a storage device comprises a memory device including a plurality of memory blocks including a plurality of memory cells connected to N, N being a natural number, gate lines stacked in a first direction, memory cells of a first group among the plurality of memory cells including memory cells of a first type, M, M being a natural number less than N, memory cells among the plurality of memory cells connected to an M-th gate line from the lowermost gate line in the first direction are a first group, N-M memory cells among the plurality of memory cells connected to an N-th gate line from an M+1-th gate line are a second group, and the memory cells of the second group including memory cells of a second type different from the first type, and a memory controller configured to control the memory device, and transmit size information of the memory cells of the second group to control a host to program data into the memory cells of the second group.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

Figure 1:
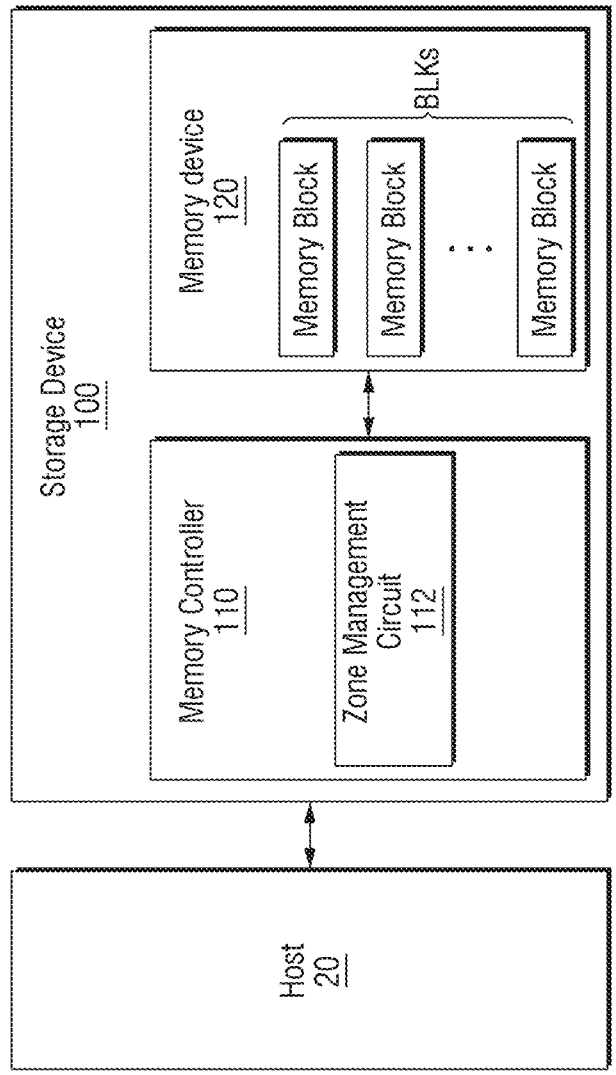
FIGS. 1 and 2 are diagrams illustrating a data processing system according to some example embodiments.
Figure 2:
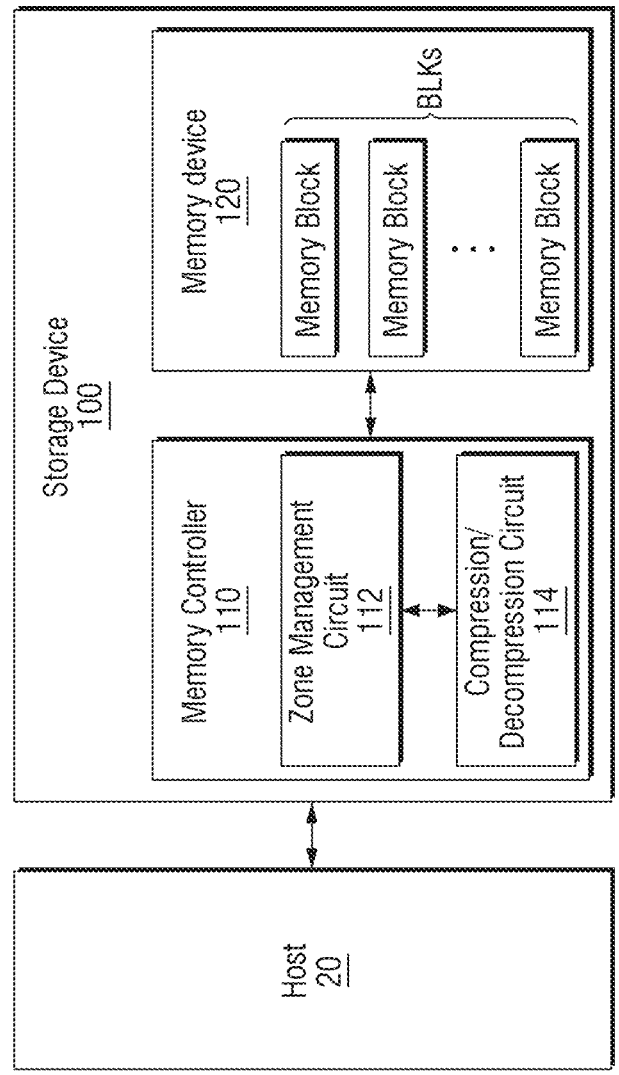

FIGS. 1 and 2 are diagrams illustrating a data processing system according to some example embodiments.

For reference, a data processing system 10 of FIG. 1 according to some example embodiments is different from a data processing system 11 of FIG. 2 according to some example embodiments only in that a memory controller 110 of the data processing system 10 does not include a compression/decompression circuit 114, and a memory controller 110 of the data processing system 11 includes a compression/decompression circuit 114. Therefore, for convenience of explanation, the configuration and operation of the data processing system 10 of FIG. 1 is replaced with a description of the structure and operation of the data processing system 11 of FIG. 2.

Referring to FIGS. 1 and 2, the data processing system 11 may include a host 20 and a storage device 100. The host 20, which is a data processing device, may be any one of a central processing unit (CPU), a graphic processing unit (GPU), a neural processing unit (NPU), and the like.

In the present specification, the host 20 may be referred to as a host processor or a host device. The host 20 may communicate with the storage device 100 to write data generated while performing a processing operation on data to the storage device 100 or to read data required for the processing operation from the storage device 100. The host 20 may communicate with the storage device 100 using at least one of various communication methods such as universal serial bus (USB), serial at attachment (SATA), small computer system interface (SCSI), serial attached SCSI (SAS), high speed interchip (HSIC), peripheral component interconnection (PCI), PCI express (PCIe), and non-volatile memory express (NVMe).

The storage device 100 may include a memory controller 110 and a memory device 120. The memory controller 110 may control a memory operation and a background operation of the memory device 120. As an example, the memory operation may include a write operation (or a program operation), a read operation, and/or an erase operation. As an example, the background operation may include at least one of a garbage collection operation, a wear leveling operation, and/or a bad block management operation.

In some example embodiments, the memory device 120 may be implemented as various types such as a NAND flash memory, a NOR flash memory, a resistive random access memory (RRAM), a phase-change memory (PRAM), a magnetoresistive random access memory (MRAM), a ferroelectric random access memory (FRAM), and/or spin transfer torque random access memory (STT-RAM). Hereinafter, example embodiments of the present disclosure will be described focusing on an example in which the memory device 120 is implemented as a NAND flash memory, and some example embodiments of the NAND flash memory will be described later with reference to FIGS. 9 to 11.

In some example embodiments, the memory controller 110 may include a zone management circuit 112 and a compression/decompression circuit 114. Although the memory controller 110 is disclosed in FIG. 2 as including the zone management circuit 112 and the compression/decompression circuit 114 in order to emphasize a characteristic operation of the memory controller 110, this is only some example embodiments, and the memory controller 110 may directly perform operations of the zone management circuit 112 and the compression/decompression circuit 114. Meanwhile, the zone management circuit 112 and the compression/decompression circuit 114 may be implemented as hardware logic or may be implemented as software logic and may also be executed by the memory controller 110.

The zone management circuit 112 may support a zoned name space technology for the host 20 to divide and use a plurality of memory blocks BLKs in zone units.

In the present specification, the name space refers to a size of a nonvolatile memory that may be formatted as a logical area (or logical block) at one time. Based on the zoned namespace technology, the storage device 100 may sequentially perform a write operation on each of the plurality of zones in response to a request from the host 20.

As an example, when the host 20 executes a first application program, the host 20 may write data for the first application program in a first zone allocated to the first application program, and thus properties of the data written in the first zone may be similar. In addition, logical addresses of logical pages included in one zone may be consecutive, and the zone management circuit 112 may sequentially write data to the logical pages.

Figure 3:
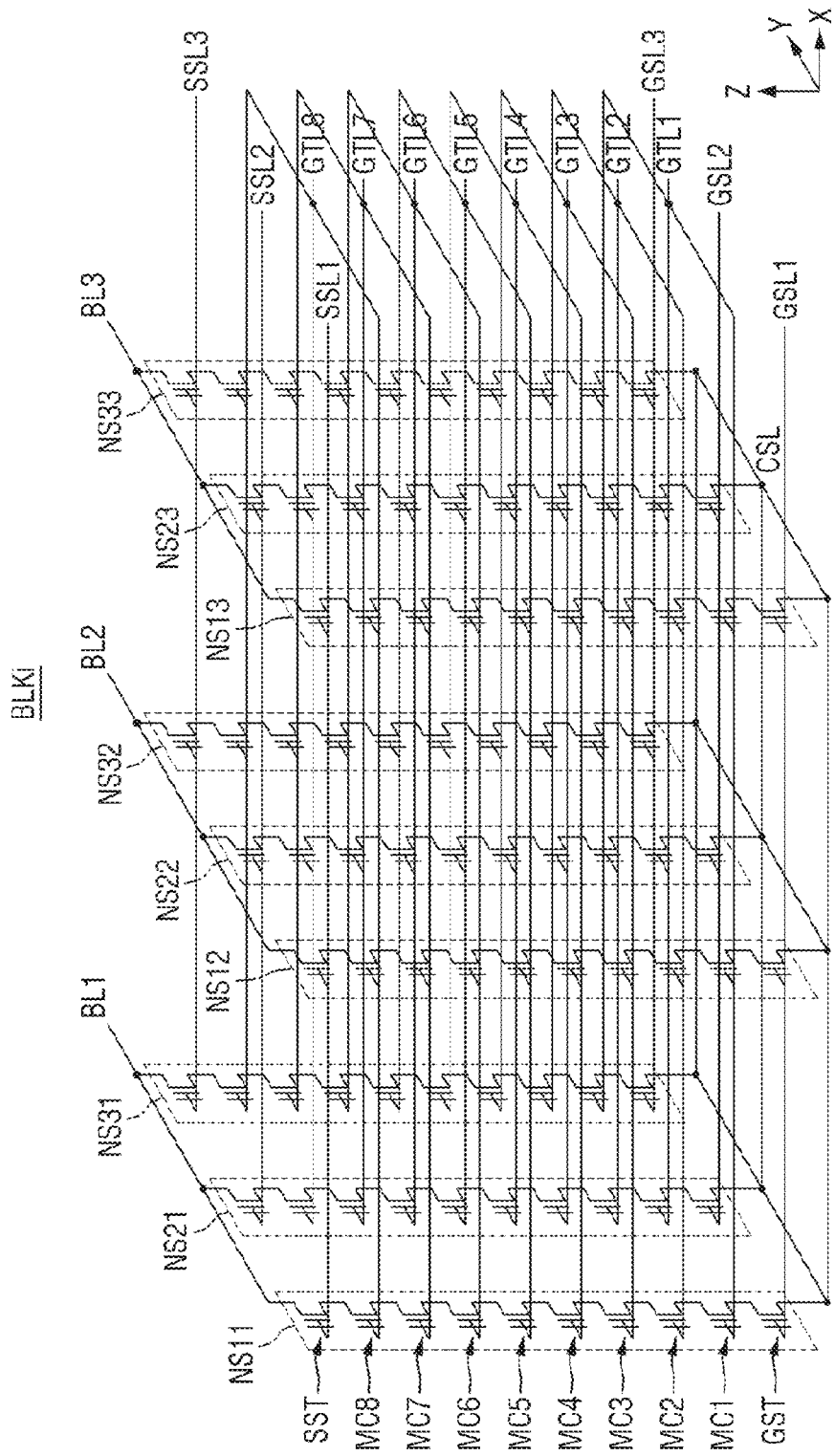
FIG. 3 is a circuit diagram illustrating a memory block according to some example embodiments.

FIG. 3 is a circuit diagram illustrating a memory block according to some example embodiments.

Figure 8:
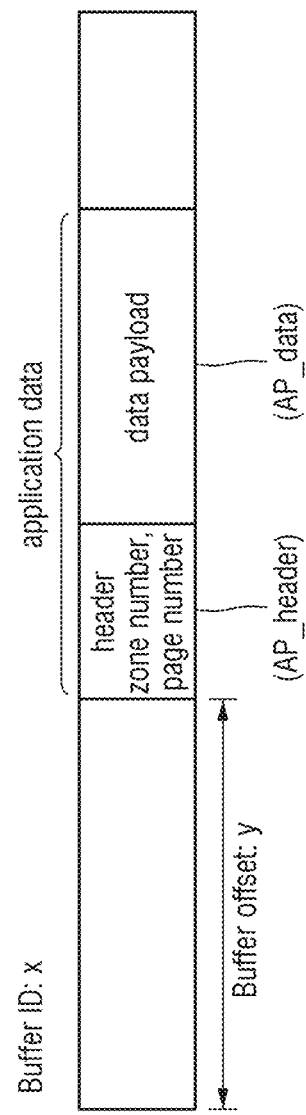
FIG. 8 is a diagram for describing an operation of the data processing system of FIG. 7 according to some example embodiments.

Referring to FIG. 3, a memory block BLKi may be one of the memory blocks BLKs of FIGS. 1 and 2. The memory block BLKi may include a plurality of memory NAND strings NS11 to NS33 connected between bit lines BL1, BL2, and BL3 and a common source line CSL. Each of the plurality of memory NAND strings NS11 to NS33 may include a string select transistor SST, a plurality of memory cells MC1, MC2, . . . , MC8, and a ground select transistor GST. It is illustrated in FIG. 8 that each of the plurality of memory NAND strings NS11 to NS33 includes eight memory cells MC1, MC2, . . . , MC8, but the present disclosure is not necessarily limited thereto.

The string select transistor SST may be connected to a corresponding string select line SSL1, SSL2, or SSL3. The plurality of memory cells MC1, MC2, . . . , MC8 may be connected to corresponding gate lines GTL1, GTL2, . . . , GTL8, respectively. The gate lines GTL1, GTL2, . . . , GTL8 may correspond to word lines, and some of the gate lines GTL1, GTL2, . . . , GTL8 may correspond to dummy word lines. The ground select transistor GST may be connected to a corresponding ground select line GSL1, GSL2, or GSL3. The string select transistor SST may be connected to a corresponding bit line BL1, BL2, or BL3, and the ground select transistor GST may be connected to the common source line CSL.

A word line (e.g., WL1) having the same height may be connected in common, and the ground select lines GSL1, GSL2, and GSL3 and the string select lines SSL1, SSL2, and SSL3 may be separated from each other. It is illustrated in FIG. 8 that the memory block BLK is connected to the eight gate lines GTL1, GTL2, . . . , GTL8 and the three bit lines BL1, BL2, and BL3, but the present disclosure is not necessarily limited thereto.

The number of the plurality of gate lines GTL1 to GTL8 stacked in a first direction Z is not limited in this figure, and may be N (N is a natural number).

In the plurality of gate lines GTL1, GTL2, . . . , GTL8, for example, M (M is a natural number less than N) number of gate lines (e.g., the third gate line GTL3 from the first gate line GTL1) from the lowermost gate line (e.g., the first gate line GTL1) at the lowermost end in the first direction Z (e.g., a direction in which the ground select line GSL is positioned) may be defined as first group or edge gate lines.

The memory cells (e.g., the first memory cell MC1 to the third memory cell MC3) connected to the first group or edge gate lines may have a first type.

In addition, second group gate lines (e.g., the fourth gate line GTL4 to the eighth gate line GTL8) other than the first group or edge gate lines among the plurality of gate lines GTL1, GTL2, . . . , GTL8 may be defined as second group or primitive gate lines.

The memory cells (e.g., the fourth memory cell MC4 to the eighth memory cell MC8) connected to the second group or primitive gate lines may have a second type different from the first type.

When the second type is a quad level cell (QLC), the first type may be a single level cell (SLC), a multi level cell (MLC), or a triple level cell (TLC).

When the second type is the TLC, the first type may be the MLC or the SLC.

When the second type is the MLC, the first type may be the SLC.

The memory controller of the data processing system according to some example embodiments may transmit only size information of the memory cells connected to the second group or primitive gate lines to the host.

That is, the host of the data processing system according to some example embodiments may transmit data to the memory controller with only the size information transmitted from the memory controller without having to determine what type of memory cells the blocks inside the storage device are made of.

Through this, operational efficiency of the data processing system according to some example embodiments may be improved.

Figure 4:
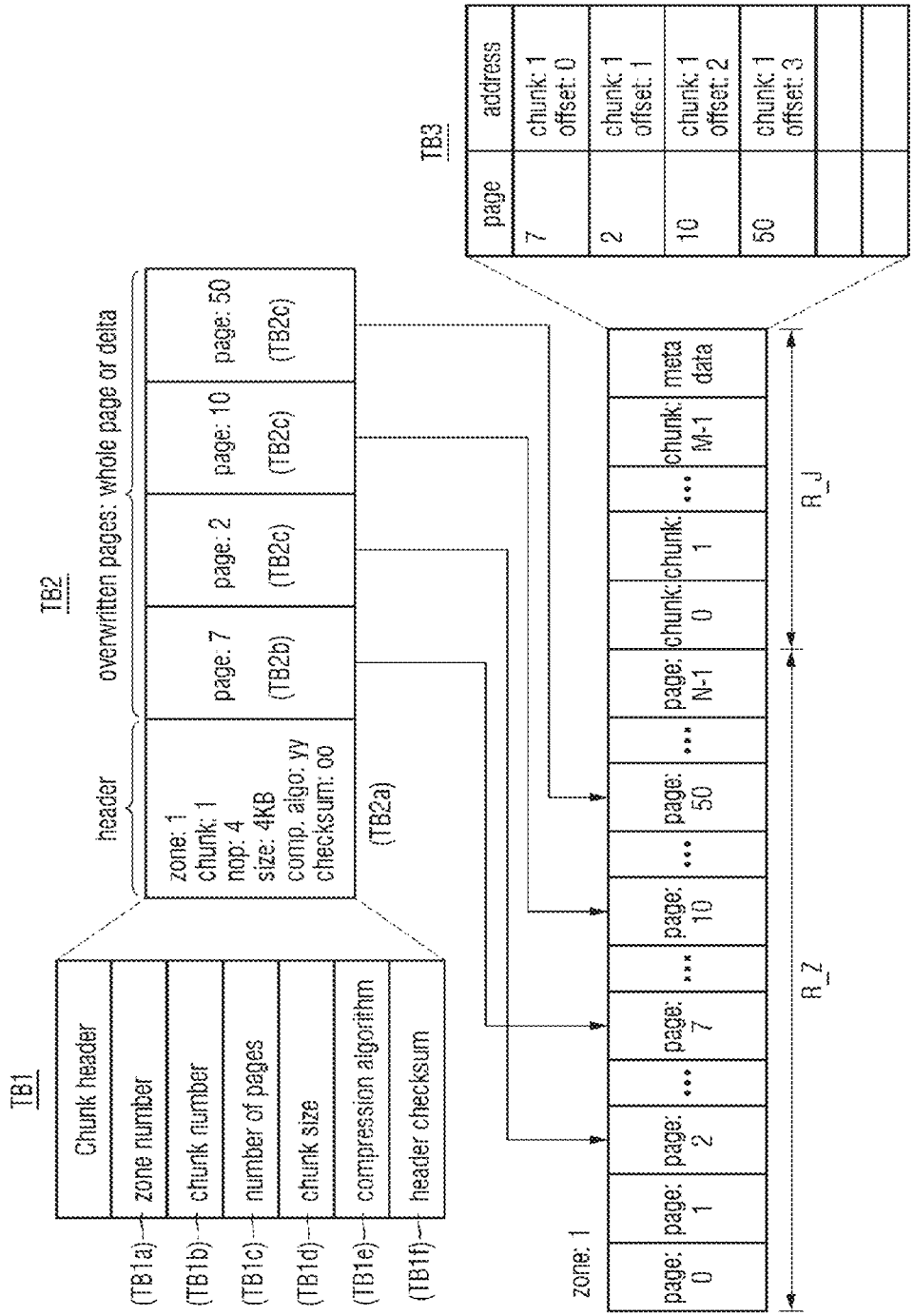
FIG. 4 is a diagram in which a memory block is described as a zone according to some example embodiments.

FIG. 4 is a diagram in which a memory block is described as a zone according to some example embodiments.

Referring to FIGS. 1 to 4, the memory block illustrated in FIG. 3 may be recognized as, for example, a first zone (zone: 1) of a logical area viewed by the host 20.

The memory controller 110 may transmit a second table TB2 containing information of the first zone (zone: 1) to the host 20.

The second table TB2 includes a header and pages overwritten in the first zone (zone: 1) or delta information. The delta information will be described in detail later.

The second table TB2 may include, for example, data for pages (a seventh page (page: 7), a second page (page: 2), a tenth page (page: 10), and a fiftieth page (page: 50)) overwritten in the first zone (zone: 1) or delta information.

If the memory controller 110 uses a compression function, the first zone (zone: 1) may also include a plurality of chunk information (chunk: 0 to chunk: M−1).

An area in which page information of the first zone (zone: 1) is stored may be defined as a zone area (R_Z), and an area in which the plurality of chunk information (chunk: 0 to chunk: M−1) and metadata are stored may be defined as a journal area R_J.

A third table TB3 including address information for each page may be stored in the metadata of the first zone (zone: 1).

The third table TB3 may store a chunk address and an offset address for each page.

The offset address may indicate an offset address from which a corresponding page starts in a physical address corresponding to the logical address for the first zone (zone: 1).

The header of the second table TB2 may include information on the overwritten page. For example, the header of the second table TB2 may include a zone number including overwritten pages, a chunk number, the number of pages, a chunk size, a compression algorithm, and a header checksum.

The host 20 may request a write to the first zone (zone: 1) of the storage device 100. In this case, when the page requested to be written is overwritten (e.g., the number of writes allowed for the page is exceeded), the host 20 may store overwritten data or delta information by utilizing the journal area R_J of the first zone (zone: 1). This will be described below.

Figure 5:
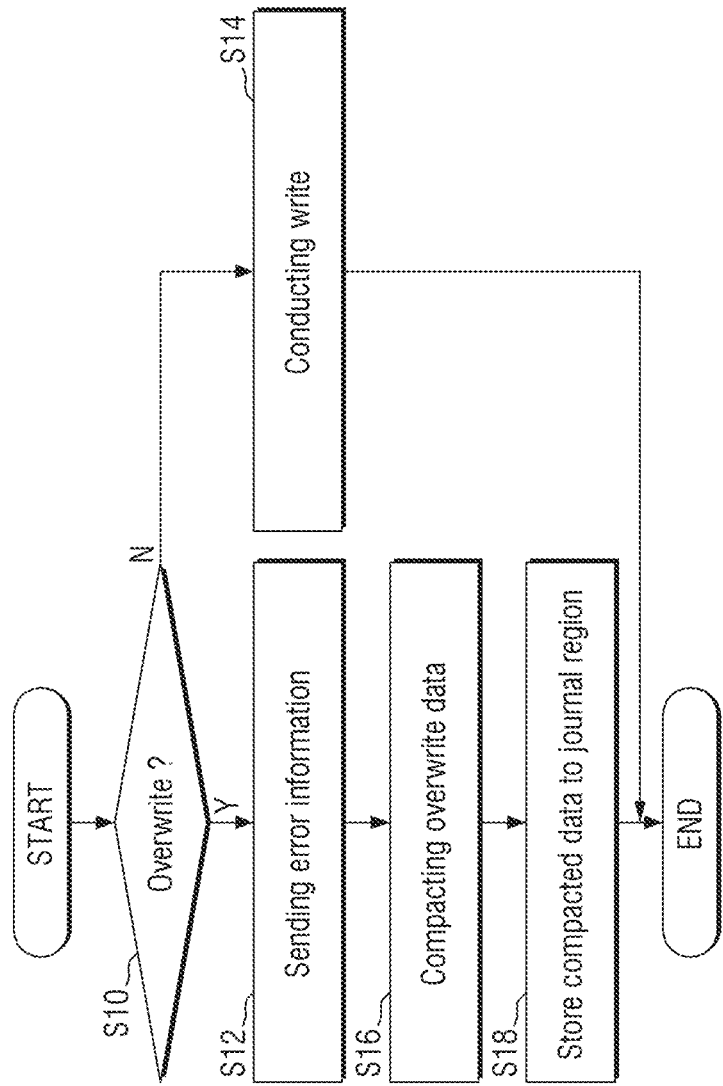
FIG. 5 is a flowchart for describing an operation of a data processing system according to some example embodiments.
Figure 6:
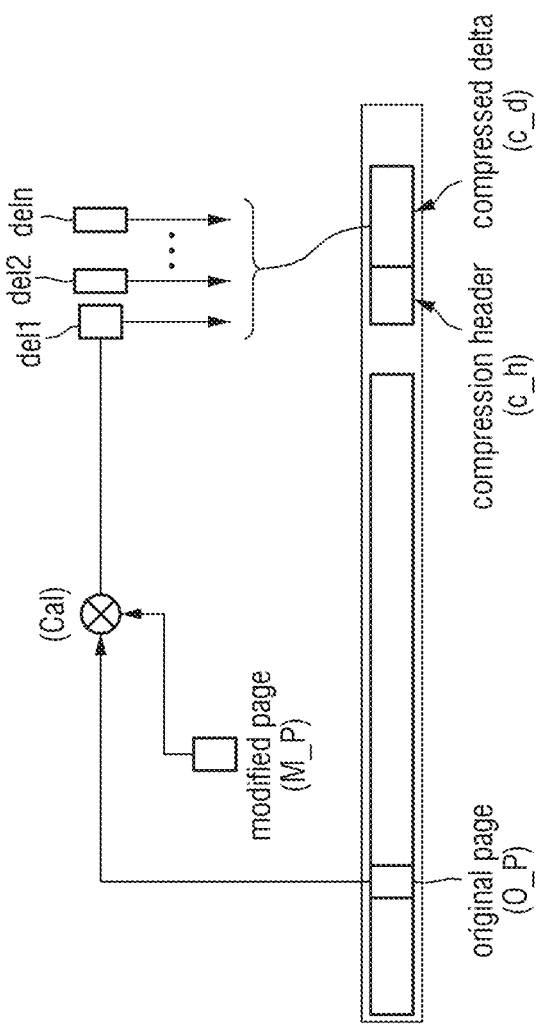
FIG. 6 is a diagram for describing an operation of a data processing system based on an overwrite occurring according to some example embodiments.

FIG. 5 is a flowchart for describing an operation of a data processing system according to some example embodiments. FIG. 6 is a diagram for describing an operation of a data processing system according to some example embodiments when an overwrite occurs.

Referring to FIGS. 1 to 5, for example, it is assumed that the host 20 transmits a write request for the seventh page (page: 7), the second page (page: 2), the tenth page (page: 10), and the fiftieth page (page: 50) of the first zone (zone: 1) of the storage device 100.

The seventh page (page: 7), the second page (page: 2), the tenth page (page: 10), and the fiftieth page (page: 50) of the first zone (zone: 1) are areas including the memory cells (e.g., the fourth memory cell MC4 to the eighth memory cell MC8) connected to the second group or primitive gate lines described above with reference to FIG. 3. Alternatively, the seventh page (page: 7), the second page (page: 2), the tenth page (page: 10), and the fiftieth page (page: 50) of the first zone (zone: 1) are the zone areas described with reference to FIG. 4.

The storage device 100 determines whether an overwrite has occurred in the seventh page (page: 7), the second page (page: 2), the tenth page (page: 10), and the fiftieth page (page: 50) (S10).

If it is determined that the overwrite has not occurred (N), the storage device 100 writes the data requested by the host 20 on the seventh page (page: 7), the second page (page: 2), the tenth page (page: 10), and the fiftieth page (page: 50) (S14).

If it is determined that the overwrite has occurred (Y), the memory controller 110 transmits error information indicating that writing to the corresponding pages is impossible to the host 20 (S12).

Thereafter, the memory controller 110 utilizes the journal area R_J described with reference to FIG. 4 to store data to be overwritten in the first zone (zone: 1). The journal area R_J is an area including, for example, the memory cells (e.g., the first memory cell MC1 to the third memory cell MC3) connected to the first group or edge gate lines described with reference to FIG. 3.

More specifically, data or delta information to be overwritten is written to the journal area R_J. This will be described in detail with reference to FIG. 6.

Referring to FIGS. 1 to 6, first, a case in which the memory controller 110 of the data processing system 10 according to some example embodiments does not support a compression function as illustrated in FIG. 1 will be described as an example.

In this case, the host 20 compresses the data to be overwritten and writes the compressed data to the journal area R_J. The host 20 calculates a delta when a size of the compressed data is greater than a capacity supported by the journal area R_J. A method of calculating the delta is described in detail with reference to FIG. 6.

For example, it is assumed that the host 20 recognizes both data corresponding to an original page O_P of the first zone (zone: 1) and information on modified page M_P to be overwritten by the host 20. If the information on the modified page M_P to be overwritten is not cached in the host 20, the host 20 may request the storage device 100 to receive the information on the modified page M_P.

The host 20 calculates a difference between the original page O_P and the modified page M_P, and calculates delta information del1 and del2 to deln corresponding to the difference.

In this case, when the calculated delta information del1 and del2 to deln is greater than the capacity supported by the journal area R_J, the host 20 writes compressed delta information c_d to the journal area R_J by performing compression. Specific information on the delta information del1 and del2 to deln may be stored in the compression header c_h in the third table TB3 described above with reference to FIG. 4.

Unlike the above-mentioned assumption, a case in which the memory controller 110 of the data processing system 11 according to some example embodiments does not support the compression function as illustrated in FIG. 2 will be described as an example.

In this case, an operation is performed based on whether or not data information to be overwritten is cached in the host 20.

If it is assumed that the data information to be overwritten is cached in the host 20, the delta information described with reference to FIG. 6 is calculated from the host 20 and transmitted to the storage device 100.

Thereafter, the memory controller 110 compresses the delta information and writes the compressed delta information to the journal area R_J as described with reference to FIG. 6.

If it is assumed that the data information to be overwritten is not cached in the host 20, the memory controller 110 calculates the delta information described with reference to FIG. 6.

Thereafter, the memory controller 110 calculates a difference between the original page O_P and the modified page M_P, and calculates delta information del1 and del2 to deln corresponding to the difference.

In this case, when the calculated delta information del1 and del2, to deln is greater than the capacity supported by the journal area R_J, the host 20 writes compressed delta information c_d to the journal area R_J by performing compression. Specific information on the delta information del1 and del2 to deln may be stored in the compression header c_h in the third table TB3 described above with reference to FIG. 4.

Figure 7:
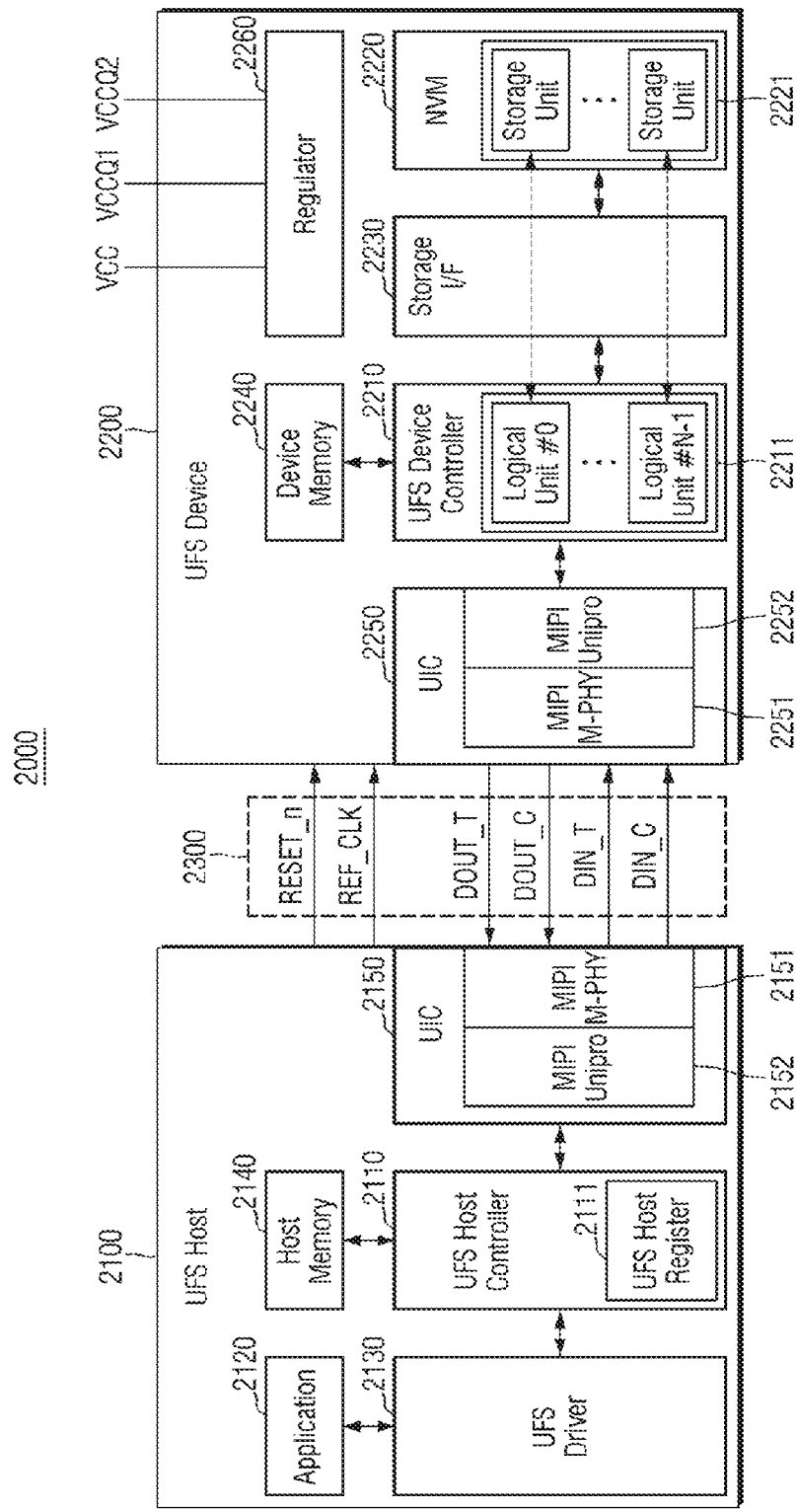
FIG. 7 is a diagram illustrating another data processing system according to some example embodiments.

The operations of the data processing system according to some example embodiments described above may also be applied to a UFS system illustrated in FIG. 7.

FIG. 7 is a diagram illustrating another data processing system according to some example embodiments.

Referring to FIG. 7, a UFS system 2000 is a system conforming to a UFS standard announced by the joint electron device engineering council (JEDEC), and may include a UFS host 2100, a UFS device 2200, and a UFS interface 2300. The description of the data processing system according to some example embodiments described above may also be applied to the UFS system 2000 of FIG. 7 within the scope not in conflict with a description below with respect to FIG. 7.

Referring to FIG. 7, the UFS host 2100 and the UFS device 2200 may be interconnected through the UFS interface 2300. The UFS host 2100 may be implemented as a portion of a corresponding application processor. The UFS device 2200 may correspond to the storage device 100 of FIGS. 1 and 2, and a UFS device controller 2210 and a nonvolatile memory 2220 may correspond to the memory controller 110 and the memory device 120 of FIGS. 1 and 2, respectively.

The UFS host 2100 may include a UFS host controller 2110, an application 2120, a UFS driver 2130, a host memory 2140, and a UFS interconnect (UIC) layer 2150. The UFS device 2200 may include a UFS device controller 2210, a nonvolatile memory 2220, a storage interface 2230, a device memory 2240, a UIC layer 2250, and a regulator 2260. The nonvolatile memory 2220 may include a plurality of memory units 2221, and such a memory unit 2221 may include a V-NAND flash memory having a two-dimensional (2D) structure or a three-dimensional (3D) structure, but may also include other types of nonvolatile memories such as a phase-change random access memory (PRAM) and/or a resistive random access memory (RRAM). The UFS device controller 2210 and the nonvolatile memory 2220 may be interconnected through the storage interface 2230. The storage interface 2230 may be implemented to comply with a standard protocol such as toggle or open NAND flash interface (ONFI).

The application 2120 may mean a program that wants to communicate with the UFS device 2200 in order to use a function of the UFS device 2200. The application 2120 may transmit an input-output request (IOR) to the UFS driver 2130 for input/output to/from the UFS device 2200. The input-output request (IOR) may mean a read request, a write request, and/or an erase request of data, but is not limited thereto.

The UFS driver 2130 may manage the UFS host controller 2110 through a UFS-host controller interface (HCI). The UFS driver 2130 may convert the input-output request generated by the application 2120 into a UFS command defined by the UFS standard, and transmit the converted UFS command to the UFS host controller 2110. One input-output request may be converted into multiple UFS commands. The UFS command may basically be a command defined by a small computer system interface (SCSI) standard, but may also be a command dedicated to the UFS standard.

The UFS host controller 2110 may transmit the UFS command converted by the UFS driver 2130 to the UIC layer 2250 of the UFS device 2200 through the UIC layer 2150 and the UFS interface 2300. In this process, a UFS host register 2111 of the UFS host controller 2110 may serve as a command queue (CQ).

The UIC layer 2150 of the UFS host 2100 may include MIPI M-PHY 2151 and MIPI UniPro 2152, and the UIC layer 2250 of the UFS device 2200 may also include MIPI M-PHY 2251 and MIPI UniPro 2252.

The UFS interface 2300 may include a line transmitting a reference clock REF_CLK, a line transmitting a hardware reset signal RESET_n for the UFS device 2200, a pair of lines transmitting a pair of differential input signals DIN_T and DIN_C, and a pair of lines transmitting a pair of differential output signals DOUT_T and DOUT_C.

A frequency value of the reference clock REF_CLK provided from the UFS host 2100 to the UFS device 2200 may be one of four values 19.2 MHz, 26 MHz, 38.4 MHz, and 52 MHz, but is not necessarily limited thereto. The UFS host 2100 may change the frequency value of the reference clock REF_CLK even during operation, that is, while data transmission/reception is performed between the UFS host 2100 and the UFS device 2200. The UFS device 2200 may generate clocks of various frequencies from the reference clock provided from the UFS host 2100 using a phase-locked loop (PLL) or the like. In addition, the UFS host 2100 may also set a value of a data rate between the UFS host 2100 and the UFS device 2200 through the frequency value of the reference clock REF_CLK. That is, the value of the data rate may be determined depending on the frequency value of the reference clock REF_CLK.

The UFS interface 2300 may support multiple lanes, and each lane may be implemented as a pair of differential lines. For example, the UFS interface 2300 may include one or more receive lanes and one or more transmit lanes. In FIG. 7, the pair of lines transmitting the pair of differential input signals DIN_T and DIN_C may constitute the receive lane, and the pair of lines transmitting the pair of differential output signals DOUT_T and DOUT_C may constitute the transmit lane. Although one transmit lane and one receive lane are illustrated in FIG. 7, the number of transmit lanes and receive lanes may be changed.

The receive lane and the transmit lane may transmit data in a serial communication manner, and the UFS host 2100 and the UFS device 2200 may communicate with each other in a full-duplex manner by a structure in which the receive lane and the transmit lane are separated from each other. That is, the UFS device 2200 may transmit the data to the UFS host 2100 through the transmit lane even while receiving the data from the UFS host 2100 through the receive lane. In addition, control data such as a command from the UFS host 2100 to the UFS device 2200 and user data that the UFS host 2100 intends to store in or read from the nonvolatile memory 2220 of the UFS device 2200 may be transmitted through the same lane. Accordingly, a separate lane for data transmission does not need to be provided between the UFS host 2100 and the UFS device 2200, in addition to a pair of receive lanes and a pair of transmit lanes.

The UFS device controller 2210 of the UFS device 2200 may entirely control the operation of the UFS device 2200. The UFS device controller 2210 may manage the nonvolatile memory 2220 through logical units (LUs) 2211 which are logical data storage units. The number of LUs 2211 may be 8, but is not limited thereto. The UFS device controller 2210 may include a flash translation layer (FTL), and may translate a logical data address, for example, a logical block address (LBA), transferred from the UFS host 2100, to a physical data address, for example, a physical block address using address mapping information of the FTL. In the UFS system 2000, a logical block for storing user data may have a size in a predetermined range. For example, a minimum size of the logical block may be set to 4 Kbytes.

When a command from the UFS host 2100 is input to the UFS device 2200 through the UIC layer 2250, the UFS device controller 2210 may perform an operation according to the input command, and may transmit a completion response to the UFS host 2100 when the operation is completed.

As an example, when the UFS host 2100 wants to store the user data in the UFS device 2200, the UFS host 2100 may transmit a data storage command to the UFS device 2200. Upon receiving a response from the UFS device 2200 indicating that the user data is ready-to-transfer, the UFS host 2100 may transmit the user data to the UFS device 2200. The UFS device controller 2210 may temporarily store the received user data in the device memory 2240, and may store the user data temporarily stored in the device memory 2240 in a selected location of the nonvolatile memory 2220 based on the address mapping information of the FTL.

As another example, when the UFS host 2100 wants to read the user data stored in the UFS device 2200, the UFS host 2100 may transmit a data read command to the UFS device 2200. The UFS device controller 2210 receiving the data read command may read the user data from the nonvolatile memory 2220 based on the data read command and temporarily store the read user data in the device memory 2240. In such a read process, the UFS device controller 2210 may detect and correct an error in the read user data using a built-in error correction code (ECC) engine (not illustrated). More specifically, the ECC engine may generate parity bits for write data to be written into the nonvolatile memory 2220, and the parity bits generated as described above may be stored in the nonvolatile memory 2220 together with the write data. At the time of reading data from the nonvolatile memory 2220, the ECC engine may correct an error of read data using the parity bits read from the nonvolatile memory 2220 together with the read data, and output the read data of which the error is corrected.

In addition, the UFS device controller 2210 may transmit the user data temporarily stored in the device memory 2240 to the UFS host 2100. In addition, the UFS device controller 2210 may further include an advanced encryption standard (AES) engine (not illustrated). The AES engine may perform at least one of an encryption operation and a decryption operation for data input to the UFS device controller 2210 using a symmetric-key algorithm.

The UFS host 2100 may sequentially store commands to be transmitted to the UFS device 2200 in the UFS host register 2111 that may function as a command queue, and sequentially transmit the commands to the UFS device 2200. In this case, even when the previously transmitted command is still being processed by the UFS device 2200, that is, even before a notification indicating that processing of the previously transmitted command by the UFS device 2200 has been completed is received, the UFS host 2100 may transmit a next command queued in the command queue to the UFS device 2200. Accordingly, the UFS device 2200 may also receive the next command from the UFS host 2100 even while processing the previously transmitted command. The maximum number of commands (for example, a queue depth) that may be stored in such a command queue may be, for example, 32. In addition, the command queue may be implemented as a circular queue type that indicates a start and an end of a command string stored in the queue through a head pointer and a tail pointer, respectively.

Each of the plurality of memory units 2221 may include a memory cell array (not illustrated) and a control circuit (not illustrated) for controlling an operation of the memory cell array. The memory cell array may include a two-dimensional memory cell array or a three-dimensional memory cell array. The memory cell array may include a plurality of memory cells, and each of the memory cells may be a single level cell (SLC) storing information of one bit, but may also be a cell storing information of two or more bits, such as a multi level cell (MLC), a triple level cell (TLC), or a quadruple level cell (QLC). The three-dimensional memory cell array may include a vertical NAND string vertically oriented so that at least one memory cell is positioned on another memory cell.

VCC, VCCQ, VCCQ2, and the like may be input to the UFS device 2200 as power supply voltages. VCC, which is a main power supply voltage for the UFS device 2200, may have a value of 2.4 to 3.6 V. VCCQ, which is a power supply voltage for supplying a voltage in a low range, is mainly for the UFS device controller 2210, and may have a value of 1.14 to 1.26 V. VCCQ2, which is a power supply voltage for supplying a voltage lower than VCC but higher than VCCQ, is mainly for an input/output interface such as the MIPI M-PHY 2251, and may have a value of 1.7 to 1.95 V. The power supply voltages may be supplied to respective components of the UFS device 2200 through the regulator 2260. The regulator 2260 may be implemented as a set of unit regulators each connected to different ones of the above-described power supply voltages.

It will be described with reference to FIG. 8 that the operation and configuration of the data processing system described above with reference to FIGS. 1 to 6 may be applied to the UFS system as illustrated in FIG. 7.

FIG. 8 is a diagram for describing an operation of the data processing system of FIG. 7 according to some example embodiments.

Referring to FIG. 8, it is assumed that there is a zone having a buffer ID: x corresponding to the nonvolatile memory device 2220.

In this case, a buffer offset for a corresponding buffer ID is designated as y, and the journal area described above with reference to FIGS. 1 to 6 may correspond to a space in which application data is stored.

That is, an application data storage area (AP_data) in which a data payload is stored may correspond to the compressed delta information (c_d) area of FIG. 6, and an application header area AP_header may correspond to the compression header c_h of FIG. 6.

That is, information on a header, a zone number, and a page number related to the data payload stored in the application data storage area AP_data may be recorded in the application header area AP_header.

Figure 9:
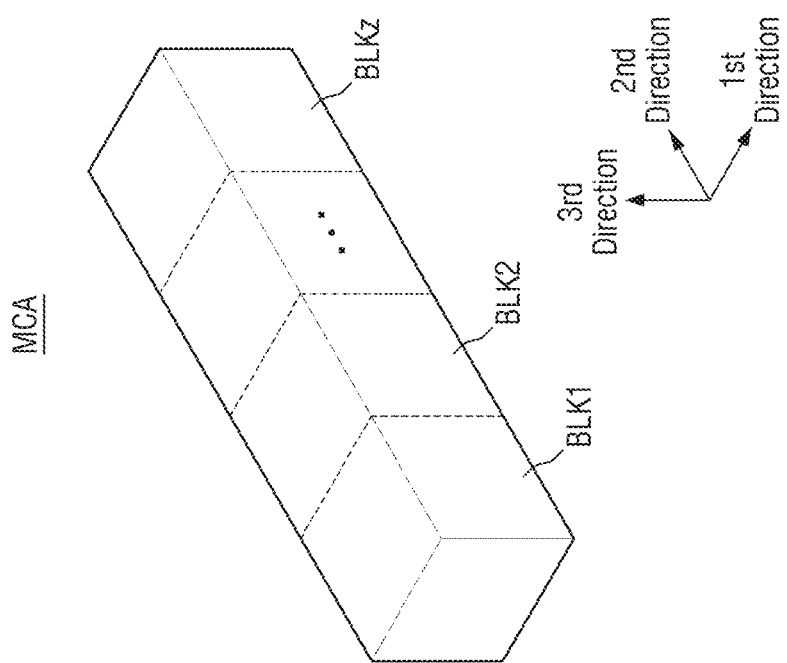
FIG. 9 is a block diagram illustrating a memory cell array of the memory device of FIGS. 1 and 2.
Figure 10:
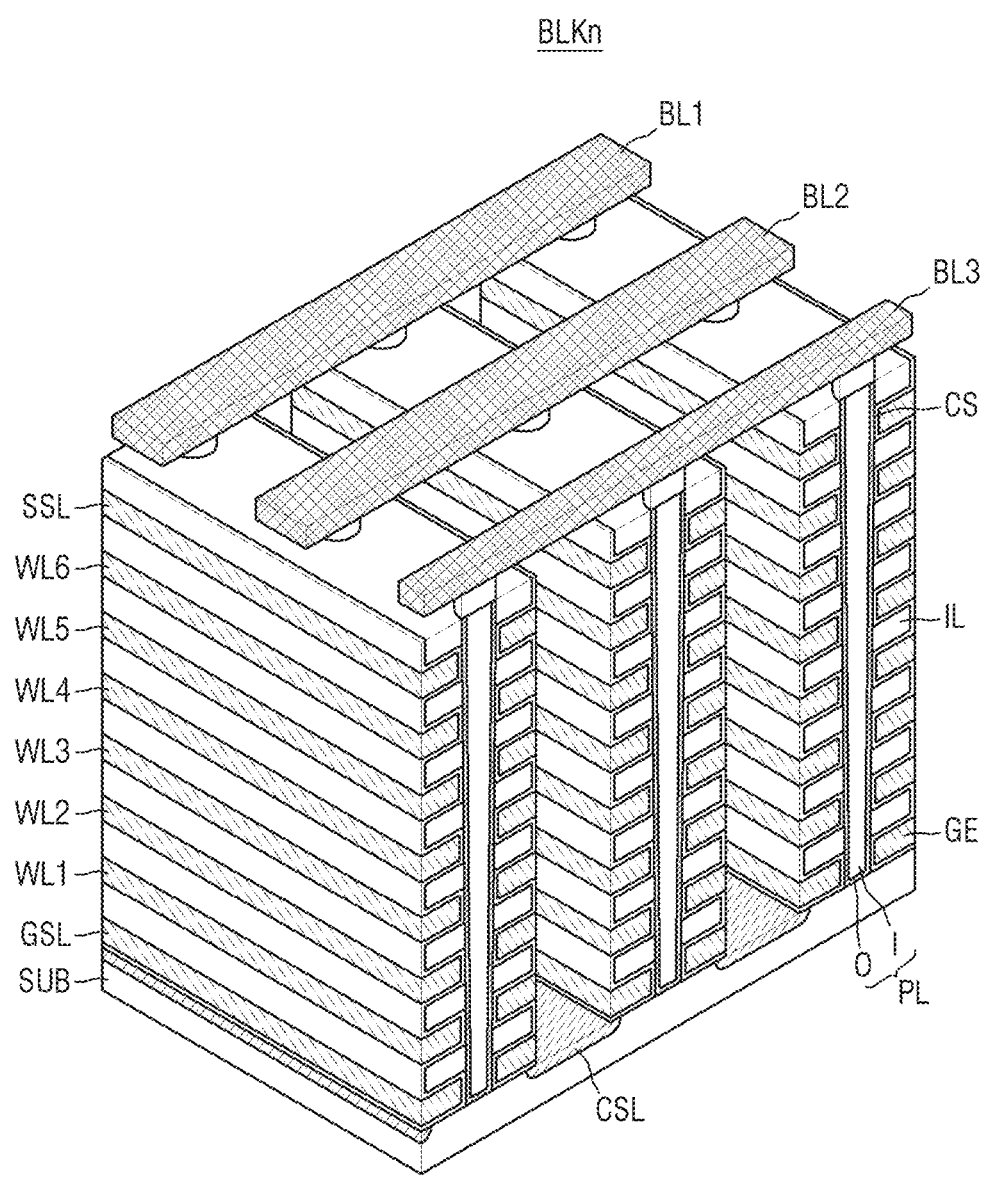
FIG. 10 is a diagram for describing a configuration of one of the memory blocks of FIG. 9.

FIG. 9 is a block diagram illustrating a memory cell array of the memory device of FIGS. 1 and 2. FIG. 10 is a diagram for describing a configuration of one of the memory blocks of FIG. 9.

Referring to FIG. 9, a memory cell array MCA may include a plurality of memory blocks BLK1 to BLKz. Each of the memory blocks BLK1 to BLKz may have a three-dimensional structure (or a vertical structure). For example, each of the memory blocks BLK1 to BLKz may include structures extending along the first to third directions. Each of the memory blocks BLK1 to BLKz may include a plurality of cell strings (not illustrated) extending in the second direction. The plurality of cell strings (not illustrated) may be spaced apart from each other in the first and third directions. The cell strings (not illustrated) of one memory block are connected to a plurality of bit lines BL, a plurality of string select lines SSL, a plurality of word lines WL, one ground select line or a plurality of ground select lines GSL, and a common source line (not illustrated). The cell strings (not illustrated) of the plurality of memory blocks BLK1 to BLKz may share the plurality of bit lines BL. For example, the plurality of bit lines BL may extend along the second direction and may be shared by the plurality of memory blocks BLK1 to BLKz.

Referring further to FIG. 10, one memory block BLKn of the plurality of memory blocks BLK1 to BLKz of FIG. 9 is formed in a vertical direction with respect to the substrate SUB. A common source line CSL is disposed on the substrate SUB, and gate electrodes GE and an insulation layer IL are alternately stacked on the substrate SUB. In addition, a charge storage layer CS may be formed between the gate electrode GE and the insulation layer IL.

When the plurality of gate electrodes GE and the insulation layer IL that are alternately stacked are vertically patterned, a V-shaped pillar PL is formed. The pillar PL penetrates through the gate electrodes GE and the insulation layer IL to be connected to the substrate SUB. An outer portion O of the pillar PL may be made of a semiconductor material and may function as a channel, and an inner portion I of the pillar PL may be made of an insulating material such as silicon oxide.

The gate electrodes GE of the memory block BLKn may be respectively connected to the ground select line GSL, the plurality of word lines WL1 to WL6, and the string select line SSL. In addition, the pillar PL of the memory block BLKn may be connected to the plurality of bit lines BL1 to BL3.

However, since the memory block BLKn illustrated in FIG. 10 is only an implementation example for convenience of explanation of the technical spirit of the present disclosure, the present disclosure is not limited thereto, and it will be fully understood that the technical spirit of the present disclosure may also be applied to various implementation examples (for example, including a two-dimensional memory structure) of the memory block BLKn.

Figure 11:
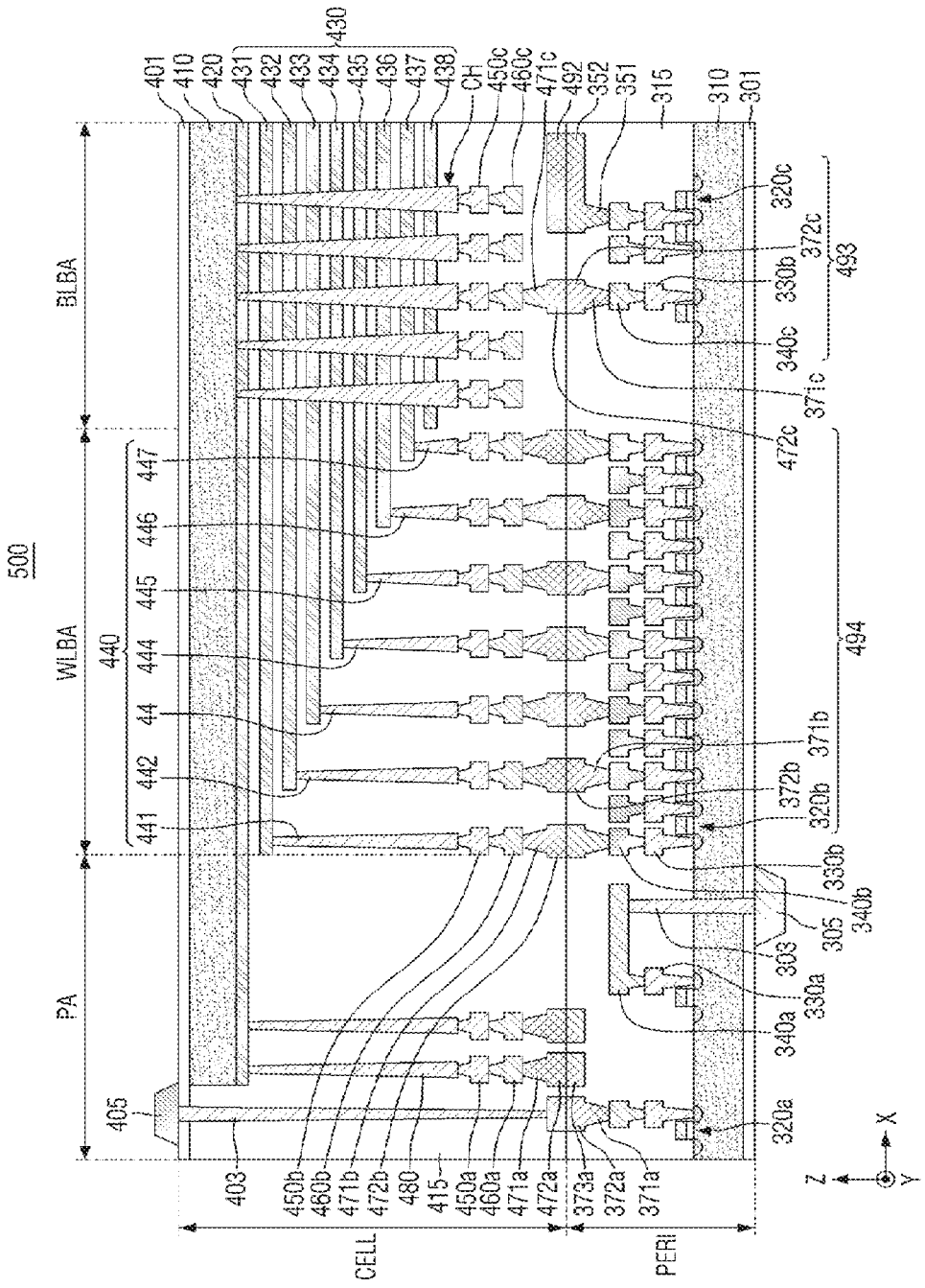
FIG. 11 is a diagram for describing a chip to chip (C2C) structure applied to a memory device according to some example embodiments of the present disclosure.

FIG. 11 is a diagram for describing a chip to chip (C2C) structure applied to a memory device according to some example embodiments of the present disclosure.

Referring to FIG. 11, a memory device 500 may have a C2C structure. The C2C structure may refer to a structure in which an upper chip including a cell area CELL is fabricated on a first wafer, a lower chip including a peripheral circuit area PER is fabricated on a second wafer different from the first wafer, and the upper chip and the lower chip are then connected to each other by a bonding method. As an example, the bonding method may refer to a method of electrically connecting a bonding metal formed on the uppermost metal layer of the upper chip and a bonding metal formed on the uppermost metal layer of the lower chip to each other. For example, when the bonding metal is formed of copper (Cu), the bonding method may be a Cu—Cu bonding method, and the bonding metal may also be formed of aluminum or tungsten.

Each of the peripheral circuit area PERI and the cell area CELL of the memory device 500 may include an external pad bonding area PA, a word line bonding area WLBA, and a bit line bonding area BLBA.

The peripheral circuit area PERI may include a first substrate 310, an interlayer insulating layer 315, a plurality of circuit elements 320a, 320b, and 320c formed on the first substrate 310, first metal layers 330a, 330b, and 330c connected to the plurality of circuit elements 320a, 320b, and 320c, respectively, and second metal layers 340a, 340b, and 340c formed on the first metal layers 330a, 330b, and 330c. In some example embodiments, the first metal layers 330a, 330b, and 330c may be formed of tungsten having relatively high resistance, and the second metal layers 340a, 340b, and 340c may be formed of copper having relatively low resistance.

In the present specification, only the first metal layers 330a, 330b, and 330c and the second metal layers 340a, 340b, and 340c are illustrated and described, but the present disclosure is not limited thereto, and one or more metal layers may be further formed on the second metal layers 340a, 340b, and 340c. At least some of the one or more metal layers formed on the second metal layers 340a, 340b, and 340c may be formed of aluminum or the like having lower resistance than copper forming the second metal layers 340a, 340b, and 340c.

The interlayer insulating layer 315 may be disposed on the first substrate 310 so as to cover the plurality of circuit elements 320a, 320b, and 320c, the first metal layers 330a, 330b, and 330c, and the second metal layers 340a, 340b, and 340c, and include an insulating material such as silicon oxide and/or silicon nitride.

Lower bonding metals 371b and 372b may be formed on the second metal layer 340b of the word line bonding area WLBA. In the word line bonding area WLBA, the lower bonding metals 371b and 372b of the peripheral circuit area PERI may be electrically connected to upper bonding metals 471b and 472b of the cell area CELL by a bonding method, and the lower bonding metals 371b and 372b and the upper bonding metals 471b and 472b may be formed of aluminum, copper, tungsten, and/or the like.

The cell area CELL may provide at least one memory block. The cell area CELL may include a second substrate 410 and a common source line 420. A plurality of word lines 430 (including word lines 431 to 438) may be stacked on the second substrate 410 in a direction (Z-axis direction) perpendicular to an upper surface of the second substrate 410. String select lines and a ground select line may be disposed on each of the upper and lower sides of the word lines 430, and the plurality of word lines 430 may be disposed between the string select lines and the ground select line.

In the bit line bonding area BLBA, a channel structure CH may extend in the direction perpendicular to the upper surface of the second substrate 410 to penetrate through the word lines 430, the string select lines, and the ground select line. The channel structure CH may include a data storage layer, a channel layer, and a buried insulating layer, and the channel layer may be electrically connected to a first metal layer 450c and a second metal layer 460c. For example, the first metal layer 450c may be a bit line contact, and the second metal layer 460c may be a bit line. In some example embodiments, the bit line 460c may extend in the first direction (Y-axis direction) parallel to the upper surface of the second substrate 410.

In some example embodiments illustrated in FIG. 11, an area in which the channel structure CH, the bit line 460c, and the like are disposed may be defined as the bit line bonding area BLBA. The bit line 460c may be electrically connected to circuit elements 320c providing a page buffer 493 in the peripheral circuit area PERI in the bit line bonding area BLBA. As an example, the bit line 460c may be connected to upper bonding metals 471c and 472c in the peripheral circuit area PERI, and the upper bonding metals 471c and 472c may be connected to lower bonding metals 371c and 372c connected to the circuit elements 320c of the page buffer 493.

In the word line bonding area WLBA, the word lines 430 may extend in the second direction (X-axis direction) parallel to the upper surface of the second substrate 410, and may be connected to a plurality of cell contact plugs 440 (including cell contact plugs 441 to 447). The word lines 430 and the cell contact plugs 440 may be connected to each other through pads provided by at least some of the word lines 430 extending in different lengths along the second direction. A first metal layer 450b and a second metal layer 460b may be sequentially connected to upper portions of the cell contact plugs 440 connected to the word lines 430. The cell contact plugs 440 may be connected to the peripheral circuit area PERI through the upper bonding metals 471b and 472b of the cell area CELL and the lower bonding metals 371b and 372b of the peripheral circuit area PERI in the word line bonding area WLBA.

The cell contact plugs 440 may be electrically connected to the circuit elements 320b providing a row decoder 494 in the peripheral circuit area PERI. In some example embodiments, an operating voltage of the circuit elements 320b providing the row decoder 494 may be different from an operating voltage of the circuit elements 320c providing the page buffer 493. As an example, the operating voltage of the circuit elements 320c providing the page buffer 493 may be greater than the operating voltage of the circuit elements 320b providing the row decoder 494.

A common source line contact plug 480 may be disposed in the external pad bonding area PA. The common source line contact plug 480 may be formed of a conductive material such as a metal, a metal compound, and/or polysilicon, and may be electrically connected to the common source line 420. A first metal layer 450a and a second metal layer 460a may be sequentially stacked on the common source line contact plug 480. As an example, an area in which the common source line contact plug 480, the first metal layer 450a, and the second metal layer 460a are disposed may be defined as the external pad bonding area PA.

Meanwhile, input/output pads 305 and 405 may be disposed in the external pad bonding area PA. A lower insulation layer 301 covering a lower surface of the first substrate 310 may be formed on a lower side of the first substrate 310, and a first input/output pad 305 may be formed on the lower insulation layer 301. The first input/output pad 305 may be connected to at least one of the plurality of circuit elements 320a, 320b, and 320c disposed in the peripheral circuit area PERI through a first input/output contact plug 303, and be separated from the first substrate 310 by the lower insulation layer 301. In addition, a side insulation layer may be disposed between the first input/output contact plug 303 and the first substrate 310 to electrically separate the first input/output contact plug 303 from the first substrate 310.

An upper insulation layer 401 covering an upper surface of the second substrate 410 may be formed on an upper side of the second substrate 410, and a second input/output pad 405 may be disposed on the upper insulation layer 401. The second input/output pad 405 may be connected to at least one of the plurality of circuit elements 320a, 320b, and 320c disposed in the peripheral circuit area PERI through a second input/output contact plug 403.

According to example embodiments, the second substrate 410 and the common source line 420 may not be disposed in an area where the second input/output contact plug 403 is disposed. In addition, the second input/output pad 405 may not overlap the word lines 430 in the third direction (Z-axis direction). The second input/output contact plug 403 may be separated from the second substrate 410 in the direction parallel to the upper surface of the second substrate 410, and may penetrate through the interlayer insulating layer 415 of the cell area CELL to be connected to the second input/output pad 405.

According to example embodiments, the first input/output pad 305 and the second input/output pad 405 may be optionally formed. As an example, the memory device 400 may include only the first input/output pad 305 disposed on the first substrate 310 or include only the second input/output pad 405 disposed on the second substrate 410. Alternatively, the memory device 400 may also include both the first input/output pad 305 and the second input/output pad 405.

In each of the external pad bonding area PA and the bit line bonding area BLBA included in each of the cell area CELL and the peripheral circuit area PERI, a metal pattern of the uppermost metal layer may exist as a dummy pattern or the uppermost metal layer may be empty.

In the external pad bonding area PA, the memory device 500 may form a lower metal pattern 373*a* having the same shape as an upper metal pattern 472*a* of the cell area CELL on the uppermost metal layer of the peripheral circuit area PERI so as to correspond to the upper metal pattern 472*a* formed on the uppermost metal layer of the cell area CELL. The lower metal pattern 373*a* formed on the uppermost metal layer of the peripheral circuit area PERI may not be connected to a separate contact in the peripheral circuit area PERI. Similarly, in the external pad bonding area PA, the memory device 500 may form an upper metal pattern having the same shape as a lower metal pattern of the peripheral circuit area PERI on the uppermost metal layer of the cell area CELL so as to correspond to the lower metal pattern formed on the uppermost metal layer of the peripheral circuit area PERI.

The lower bonding metals 371*b* and 372*b* may be formed on the second metal layer 440*b* of the word line bonding area WLBA. In the word line bonding area WLBA, the lower bonding metals 371*b* and 372*b* of the peripheral circuit area PERI may be electrically connected to the upper bonding metals 471*b* and 472*b* of the cell area CELL by a bonding method.

In addition, in the bit line bonding area BLBA, an upper metal pattern 492 having the same shape as a lower metal pattern 352 of the peripheral circuit area PERI may be formed on the uppermost metal layer of the cell area CELL so as to correspond to the lower metal pattern 352 formed on the uppermost metal layer of the peripheral circuit area PERI. A contact may not be formed on the upper metal pattern 492 formed on the uppermost metal layer of the cell area CELL.

Figure 12:
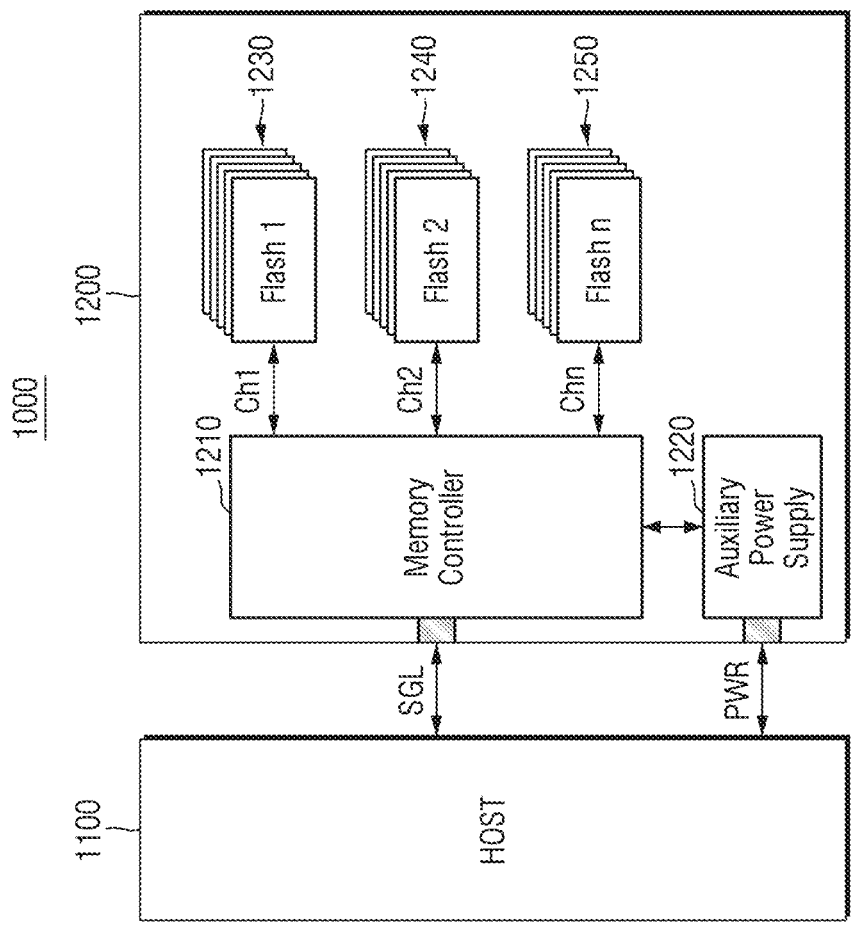
FIG. 12 is a block diagram illustrating a solid state drive (SSD) system according to some example embodiments of the present disclosure.

FIG. 12 is a block diagram illustrating a solid state drive (SSD) system according to some example embodiments of the present disclosure.

Referring to FIG. 12, a solid state drive (SSD) system 1000 may include a host 1100 and an SSD 1200. The SSD 1200 may exchange a signal SGL with the host 1100 through a signal connector, and may receive power PWR through a power connector. The SSD 1200 may include a memory controller 1210, an auxiliary power supply 1220, and a plurality of memory devices 1230, 1240, and 1250.

In some example embodiments, the memory controller 1210 may be connected to the plurality of memory (e.g., flash) devices 1230, 1240, and 1250 through channels Ch1, Ch2, and Chn, respectively, to perform a zone management operation according to the example embodiments of the present disclosure. Specifically, the memory controller 1210 may divide and compress the data received from the host 1100 into units of chunk, write the compressed chunks to the plurality of memory devices 1230, 1240, and 1250, and generate offsets of the compressed chunks. As an example, the memory controller 1210 may use a compressed chunk mapping table to directly manage the offsets of the compressed chunks. As another example, the memory controller 1210 may provide the offsets of the compressed chunks to the host 1100, and the host 1100 may directly manage the offsets of the compressed chunks.

In addition, the memory controller 1210 may induce an efficient write operation request from the host 1100 by periodically or non-periodically notifying the host 1100 of available capacities of super-blocks additionally secured as the chunks are compressed and written. In some example embodiments, the memory controller 1210 may also change an operation method for zone management for each of the memory devices 1230, 1240, and 1250.

Figure 13:
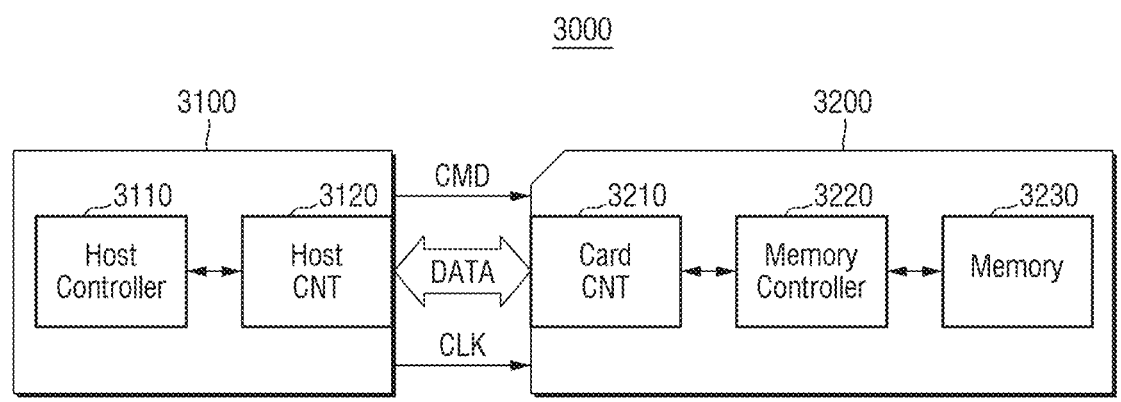
FIG. 13 is a block diagram illustrating a memory system as applied to a memory card system according to some example embodiments of the present disclosure.

FIG. 13 is a block diagram illustrating an example in which the memory system according to example embodiments of the present disclosure is applied to a memory card system.

Referring to FIG. 13, a memory card system 3000 may include a host 3100 and a memory card 3200. The host 3100 may include a host controller 3110 and a host connection unit 3120. The memory card 3200 may include a card connection unit 3210, a memory controller 3220, and a memory device 3230.

The host 3100 may write data to the memory card 3200 or read the data written to the memory card 3200. The host controller 3110 may transmit a command CMD, a clock signal CLK generated from a clock generator (not illustrated) in the host 3100, and data DATA to the memory card 3200 through the host connection unit 3120. The memory card 3200 may provide the zoned namespace interface according to the example embodiments of the present disclosure to the host 3100.

Specifically, the memory card 3200 may divide and compress the data DATA received from the host 3100 into units of chunk, write the compressed chunks to the memory device 3230, and generate offsets of the compressed chunks. As an example, the memory controller 3220 may use a compressed chunk mapping table to directly manage the offsets of the compressed chunks. As another example, the memory controller 3220 may provide the offsets of the compressed chunks to the host 3100, and the host 3100 may directly manage the offsets of the compressed chunks.

In addition, the memory card 3200 may induce an efficient write operation request from the host 3100 by periodically or non-periodically notifying the host 3100 of available capacities of super-blocks additionally secured as the chunks are compressed and stored.

The memory controller 3220 may store data in the memory device 3230 in synchronization with a clock signal generated from a clock generator (not illustrated) in the memory controller 3220 in response to a command received through the card connection unit 3210.

The memory card 3200 may be implemented as a compact flash card (CFC), a microdrive, a smart media card (SMC), a multimedia card (MMC), a security digital card (SDC), a memory stick, and a USB flash memory driver.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

The data processing system 10, 11 (or other circuitry, for example, host 20, memory controller 110, zone management circuit 112, memory device 120, compression/decompression circuit, UFS system 2000, UFS host 2100, UFS device 2200, UFS interface 2300, UFS host controller 2110, application 2120, UFS driver 2130, host memory 2140, UIC layer 2150, UFS device controller 2210, nonvolatile memory 2220, storage interface 2230, device memory 2240, UIC layer 2250, regulator 2260, memory unit 2221, logical units 2211, MIPI M-PHY 2151, 2251, MIPI UniPro 2152, 2252, SSD system 1000, host 1100, SSD 1200, memory controller 1210, auxiliary power supply 1220, memory devices 1230, etc., memory card system 3000, host 3100, memory card 3200, host controller 3110, host connection unit 3120, card connection unit 3210, memory controller 3220, memory 3230, and sub-components as discussed herein) may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Although some example embodiments of the present invention have been described above with reference to the accompanying drawings, the present disclosure is not limited to the aforementioned example embodiments, and may be manufactured in various forms different from each other. It will be understood by a person having an ordinary knowledge in the technical field to which the present disclosure pertains that the present disclosure may be embodied in other specific forms without changing the technical spirit or essential features of the present disclosure. Accordingly, the example embodiments mentioned above are to be considered in all respects as illustrative rather than restrictive.

What is claimed is:

1. A storage device comprising:
    a memory device including a plurality of memory blocks including a plurality of memory cells connected to a plurality of gate lines, memory cells of a first group among the plurality of memory cells including memory cells of a first type, memory cells other than the memory cells of the first group among the plurality of memory cells are a second group, and memory cells of the second group including memory cells of a second type different from the first type; and
    a memory controller configured to
        control the memory device,
        transmit size information of the memory cells of the first group to control a host to program data into the memory cells of the first group,
        store an update of the data programmed in the memory cells of the first group with respect to the memory cells of the second group, and
        control the host not to perform a plurality of write requests to the same address with respect to the memory cells of the first group more than an allowed number of writes.

2. The storage device of claim 1, wherein the memory cells of the second group are configured to store information to be updated with respect to the memory cells of the first group.

3. The storage device of claim 1, wherein the memory controller is configured to transmit size information of the memory cells of the second group to the host.

4. The storage device of claim 1, wherein the memory cells of the first type are triple level cells (TLCs).

5. The storage device of claim 4, wherein the memory cells of the second type are multi level cells (MLCs).

6. The storage device of claim 4, wherein the memory cells of the second type are single level cells (SLCs).

7. The storage device of claim 1, wherein the memory cells of the first type are quad level cells (QLCs).

8. The storage device of claim 7, wherein the memory cells of the second type are triple level cells (TLCs).

9. The storage device of claim 1, wherein the memory controller is configured to transmit error information indicating that writing to the memory cells of the first group is impossible to the host based on an overwrite exceeding the allowed number of writes occurs for the memory cells of the first group.

10. The storage device of claim 9, wherein the host is configured to
    compress the data to be overwritten, and
    store the compressed data in the memory cells of the second group.

11. The storage device of claim 10, wherein the host is configured to
    calculate a delta that is a difference between the data to be overwritten and original data of a page in which the data to be overwritten is recorded, and
    store the delta in the memory cells of the second group.

12. The storage device of claim 9, wherein the memory controller is configured to
    compress the data to be overwritten, and
    store the compressed data in the memory cells of the second group.

13. The storage device of claim 12, wherein the memory controller is configured to
    calculate a delta that is a difference between the data to be overwritten and original data of a page in which the data to be overwritten is recorded,
    and store the delta in the memory cells of the second group.

14. A data processing system comprising:
    a host; and
    a storage device configured to exchange data with the host, the storage device including
        a memory device including a plurality of memory blocks including a plurality of memory cells connected to a plurality of gate lines, memory cells of a first group among the plurality of memory cells including memory cells of a first type, memory cells other than the memory cells of the first group among the plurality of memory cells are a second group, and the memory cells of the second group including memory cells of a second type different from the first type; and
        a memory controller configured to
            control the memory device, and
            transmit size information of the memory cells of the first group to control the host to program data into the memory cells of the first group.

15. The data processing system of claim 14, wherein the memory cells of the second group are configured to store information to be updated with respect to the memory cells of the first group.

16. The data processing system of claim 14, wherein the memory controller is configured to transmit size information of the memory cells of the second group to the host.

17. The data processing system of claim 14, wherein, the memory controller is configured to transmit error information indicating that writing to the memory cells of the first group is impossible to the host based on an overwrite exceeding an allowed number of writes occurs for the memory cells of the first group.

18. The data processing system of claim 17, wherein the host is configured to
compress the data to be overwritten, and
store the compressed data in the memory cells of the second group.

19. The data processing system of claim 17, wherein the memory controller is configured to
compress the data to be overwritten, and
store the compressed data in the memory cells of the second group.

20. A storage device comprising:
a memory device including a plurality of memory blocks including a plurality of memory cells connected to N, N being a natural number, gate lines stacked in a first direction, memory cells of a first group among the plurality of memory cells including memory cells of a first type, M, M being a natural number less than N, memory cells among the plurality of memory cells connected to an M-th gate line from the lowermost gate line in the first direction are a first group, N-M memory cells among the plurality of memory cells connected to an N-th gate line from an M+1-th gate line are a second group, and the memory cells of the second group including memory cells of a second type different from the first type; and
a memory controller configured to
control the memory device, and
transmits size information of the memory cells of the second group to control a host to program data into the memory cells of the second group.

* * * * *